(12) United States Patent
Miller et al.

(10) Patent No.: US 7,561,387 B2
(45) Date of Patent: Jul. 14, 2009

(54) CURRENT TRANSFORMER INCLUDING A LOW PERMEABILITY SHUNT AND A TRIP DEVICE EMPLOYING THE SAME

(75) Inventors: Theodore J. Miller, Oakdale, PA (US); Joseph J. Matsko, Beaver, PA (US); Mark A. Juds, New Berlin, WI (US)

(73) Assignee: Eaton Corporation, Cleveland, OH (US)

( * ) Notice: Subject to any disclaimer, the term of this patent is extended or adjusted under 35 U.S.C. 154(b) by 515 days.

(21) Appl. No.: 11/254,536

(22) Filed: Oct. 19, 2005

(65) Prior Publication Data

US 2007/0086131 A1 Apr. 19, 2007

(51) Int. Cl.
*H02H 9/02* (2006.01)
(52) U.S. Cl. ......................... 361/35; 361/93.1
(58) Field of Classification Search .................. 361/35, 361/38, 93.1–93.9; 336/165
See application file for complete search history.

(56) References Cited

U.S. PATENT DOCUMENTS

| | | | |
|---|---|---|---|
| 2,994,039 A | 7/1961 | Parke | |
| 3,295,084 A | * 12/1966 | Horstman | .................... 336/165 |
| 4,325,096 A | 4/1982 | Sunohara et al. | |
| 4,454,557 A | 6/1984 | Hurley | |
| 4,967,145 A | 10/1990 | Davies | |
| 5,196,784 A | 3/1993 | Estes, Jr. | |
| 5,307,008 A | 4/1994 | So | |
| 5,726,846 A | 3/1998 | Houbre | |
| 5,731,666 A | * 3/1998 | Folker et al. | ................. 315/276 |
| 5,943,204 A | 8/1999 | Jones et al. | |
| 6,144,271 A | 11/2000 | Mueller et al. | |
| 6,618,684 B1 | 9/2003 | Beroset et al. | |
| 6,850,135 B1 | 2/2005 | Puskar et al. | |

FOREIGN PATENT DOCUMENTS

EP 0 003 396 8/1979

* cited by examiner

*Primary Examiner*—Danny Nguyen
(74) *Attorney, Agent, or Firm*—Martin J. Moran

(57) ABSTRACT

A current transformer comprises a coil, a core and a shunt member. The core forms a magnetic circuit and has a first permeability. At least a portion of the core is encircled by the coil. The shunt member is coupled to the core and has a second permeability. The shunt member is continuous and forms a magnetically parallel path with the at least a portion of the core encircled by the coil. The current transformer may be incorporated in to a trip device.

4 Claims, 6 Drawing Sheets

CURRENT TRANSFORMER INCLUDING A LOW PERMEABILITY SHUNT AND A TRIP DEVICE EMPLOYING THE SAME

BACKGROUND OF THE INVENTION

1. Field of the Invention

The present invention relates generally to electrical transformers and, more particularly, to current transformers. The invention also relates to trip devices including one or more current transformers.

2. Background Information

Trip devices are often used to protect the primary conductors of a power circuit. Trip devices typically include trip circuitry and a number of current transformers. The current transformers may supply electrical power to the trip circuitry and/or provide a signal to the trip circuitry corresponding to the amount of current flowing within the primary conductors. The current transformers interface with the primary conductors of the power circuit and transform a relatively high magnitude current flowing within the primary conductors into a relatively low magnitude current for use by the associated trip circuitry.

FIG. 1 is a simplified illustration of a known current transformer 70 which includes a high permeability core 72 that surrounds a conductor 78 of a power circuit. A portion 72a of the core 72 passes through a coil 74 (which is shown cut away in FIG. 1). A relatively small current, which may be supplied to other circuitry (not shown) via lead lines 75, is produced in the coil 74 when a relatively large current flows in conductor 78. The small current produced in the coil 74 is substantially linear over a wide operating range. Thus, as the current in conductor 78 increases, current in excess of that needed for sensing and power is generated in the coil 74. Undesirably, this excess current must be dissipated by the current transformer 70 or other devices (not shown).

FIG. 2 is a simplified illustration of another known current transformer 80 incorporating shunt 86 with an air gap 88. The current transformer 80 includes a high permeability core 82 that surrounds the conductor 78 of the power circuit. A portion 82a of the core 82 passes through a coil 84 (which is shown cut away in FIG. 2). When a relatively small current flows in conductor 78, the flux in the core 82 is low enough to avoid saturation, and air gap 88 keeps the flux in the core 82 and out of the shunt 86. As the primary current increases, the flux in the core 82 (due to the presence of the parallel magnetic paths) reaches a point where it saturates. At this point, the increase in flux with the primary current is dramatically reduced. As a result, the increase of the current in coil 84 is reduced (i.e., no longer increases). Accordingly, the current response of the current transformer 80 is substantially non-linear and is generally determined by the shape and size of the air gap 88. The transformer 80 includes electrical leads 85 for supplying the current developed in the coil 84 to other circuitry (not shown).

Thus, a need exists for an improved current transformer. There also exists a need for an improved trip device including a current transformer.

SUMMARY OF THE INVENTION

These needs and others are met by the present invention, which is directed to a current transformer which comprises a coil, a core forming a magnetic circuit and having a first permeability, wherein at least a portion of the core is encircled by the coil, and a shunt member coupled to the core and having a different second permeability, wherein the shunt member is continuous and forms a magnetically parallel path with the at least a portion of the core encircled by the coil.

As another aspect of the invention, a trip device is for a protected circuit. The trip device comprises separable contacts structured to interrupt a current flowing in the protected circuit, an operating mechanism structured to open and close the separable contacts, a trip mechanism responsive to a first signal, the trip mechanism cooperating with the operating mechanism to trip open the separable contacts, a sensing device associable with the protected circuit, the sensing device outputting the first signal, a current transformer associable with the protected circuit, and a power supply circuit responsive to the second signal, the power supply circuit structured to provide power to at least one of the trip mechanism and the operating mechanism. The current transformer comprises a coil outputting a second signal responsive to the current flowing in the protected circuit, a core forming a magnetic circuit and having a first permeability and wherein at least a portion of the core is encircled by the coil, and a shunt member coupled to the core and having a different second permeability, wherein the shunt member is continuous and forms a magnetically parallel path with the at least a portion of the core encircled by the coil.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
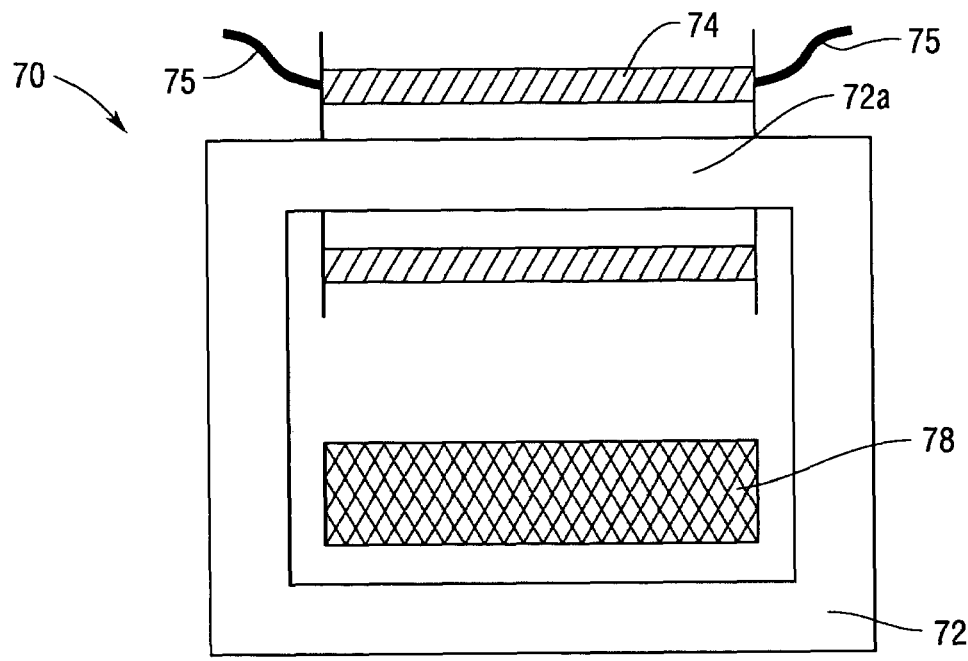
FIG. 1 is a simplified illustration of a current transformer.
Figure 2:
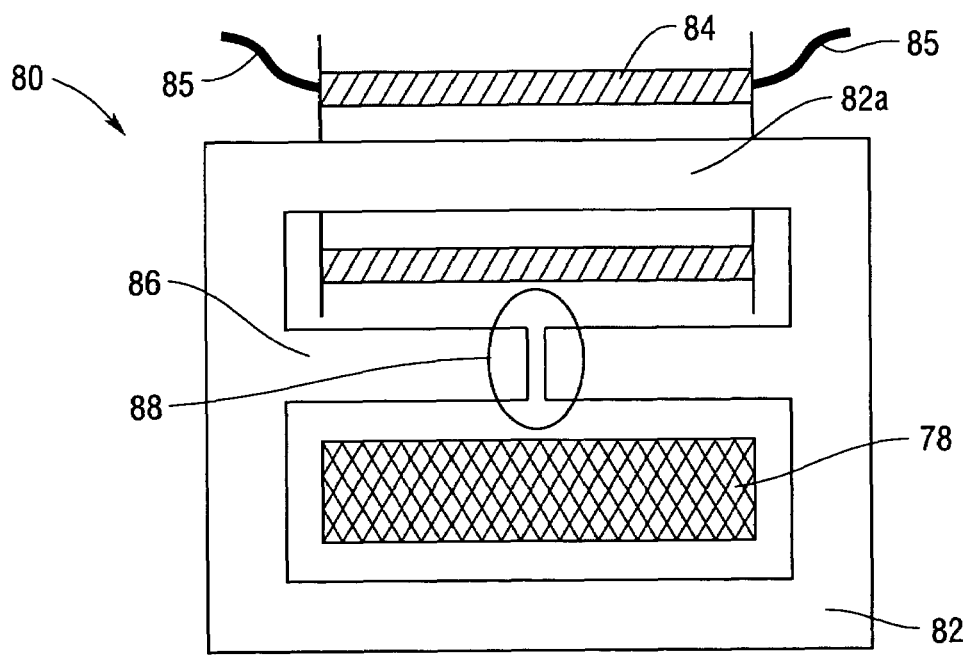
FIG. 2 is a simplified illustration of another current transformer.

Directional phrases used herein, such as, for example, left, right, clockwise, counterclockwise, top, bottom, up, down, and derivatives thereof, relate to the orientation of the elements shown in the drawings and are not limiting upon the claims unless expressly recited therein.

As employed herein, the term "number" shall mean one or more than one.

As employed herein, the statement that two or more parts are "connected" or "coupled" together shall mean that the parts are joined together either directly or joined together through one or more intermediate parts. Further, as employed herein, the statement that two or more parts are "attached" shall mean that the parts are joined together directly.

Figure 3:
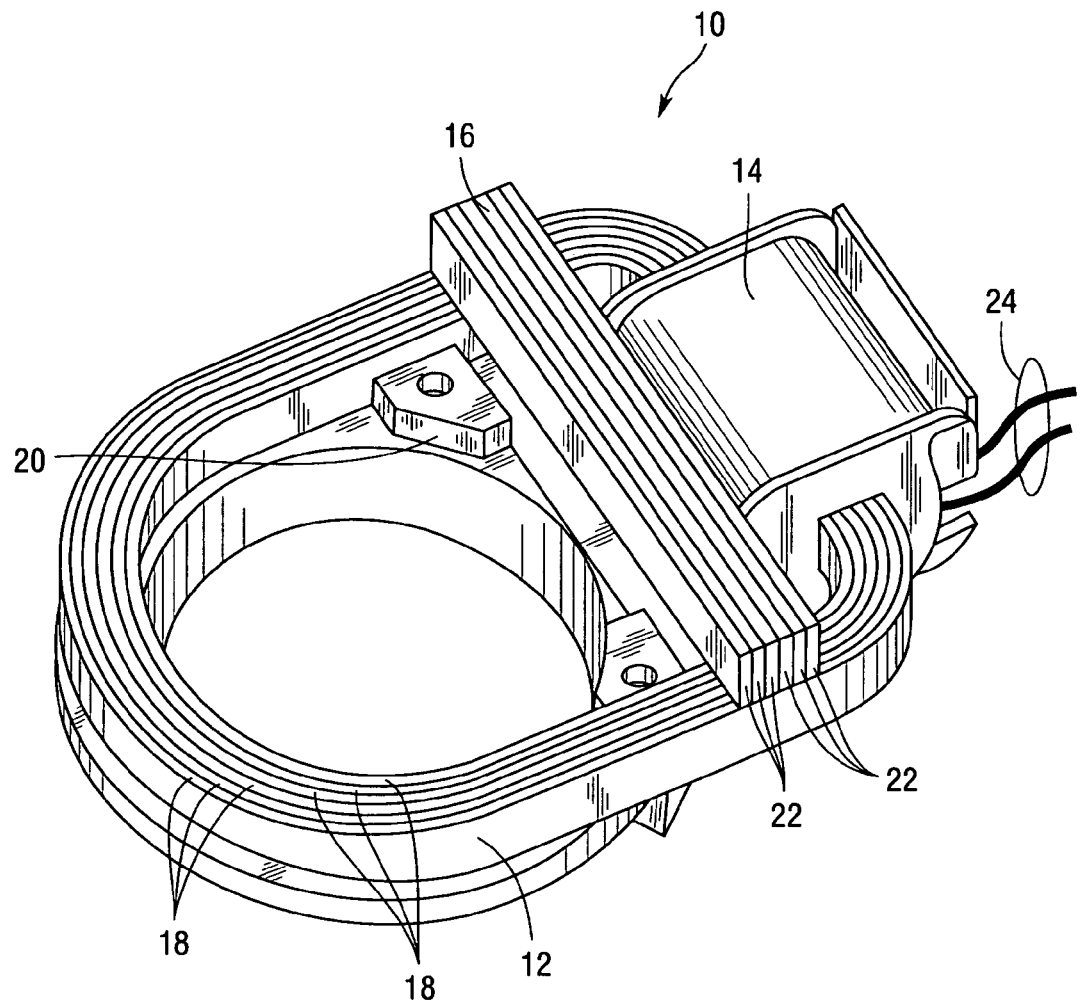
FIG. 3 is an isometric view of a current transformer according to one embodiment of the invention.
Figure 4:
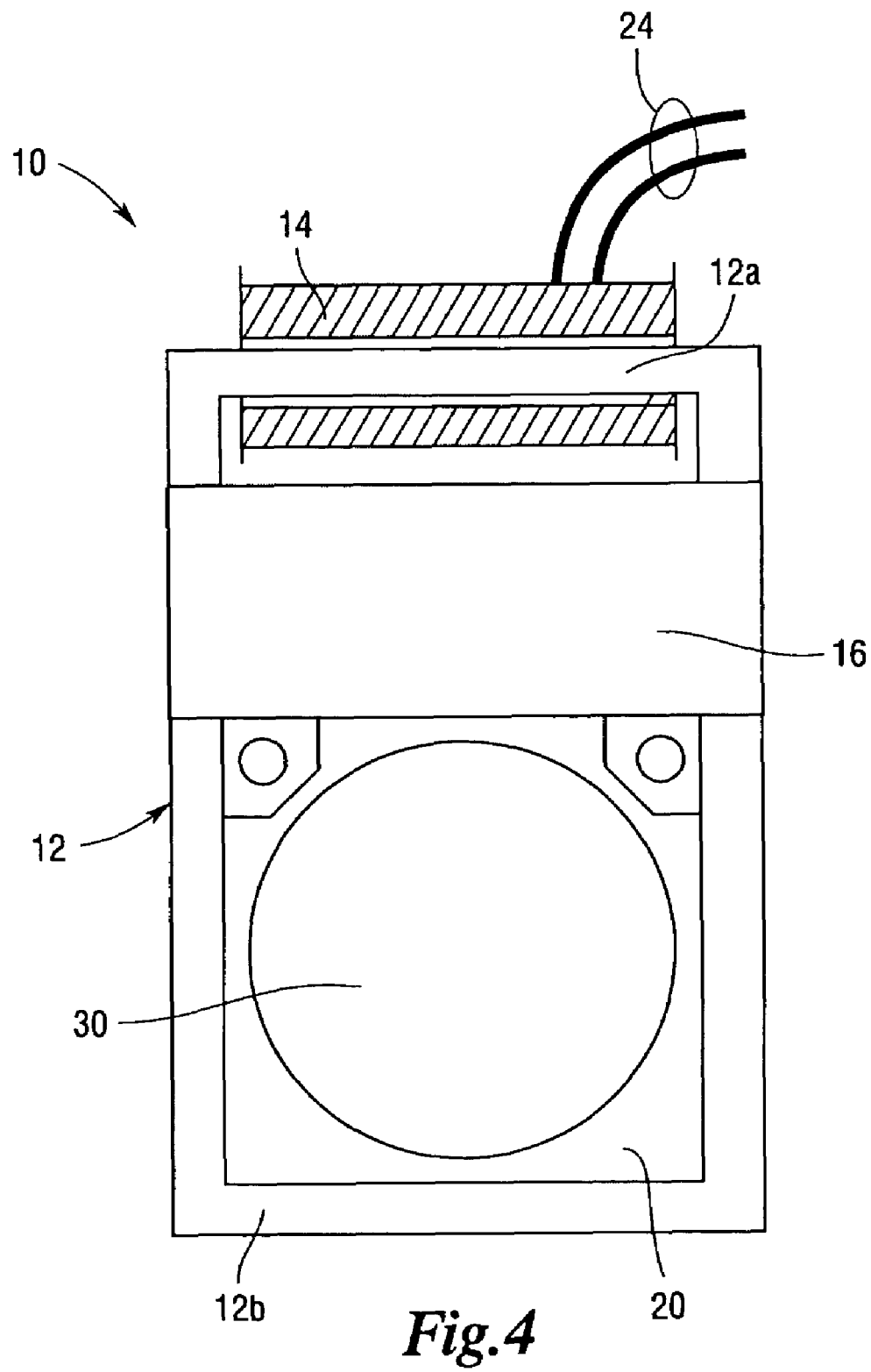
FIG. 4 is a simplified view of the current transformer of FIG. 3.

FIGS. 3 and 4 show a current transformer 10 including a core 12, a coil 14, and a shunt member 16. Two or more electrical lead wires 24 are structured to electrically connect the coil 14 to an external circuit (such as, for example, trip device circuitry) (not shown). In the current example, the core 12 is made of a number of laminae 18 (for example, without limitation, steel plates) which are coupled together to form a magnetic circuit. Although laminated in the current embodiment, it should be noted that the core 12 may be constructed in a different manner (e.g., may be solid) while remaining within the scope of the present invention. It should further be noted that the permeability of the core 12 is dependent upon the specific material chosen (here steel) and the specific manner of construction (here laminated).

As best seen in FIG. 4, a portion 12a of the core 12 is encircled by the coil 14 (which is shown cut away in FIG. 4). Another portion 12b of the core 12 is structured to surround a primary conductor 30 (as seen in FIG. 4). As will be discussed in more detail in conjunction with FIG. 8, the current transformer 10 may be used within a trip device 40 and the primary conductor 30 may be part of a circuit that the trip device 40 is tasked to protect. A clamp 20 may be used to secure the current transformer 10 to the primary conductor 30.

Continuing to refer to FIG. 4, shunt member 16 is coupled to the core 12 and separates the core portion 12a encircled by the coil 14 and the core portion 12b surrounding the primary conductor 30. The shunt member 16 forms a magnetically parallel path with the core portion 12a that is encircled by the coil 14. Shunt member 16 is continuous (i.e., shunt member 16 does not include an air gap) and is coupled to the core 12 within the normal manufacturing tolerances (i.e., no special preparations are needed at the core/shunt interface). For example, in the current example, shunt member 16 is coupled to core 12 using a typical welding process. Although discussed above in the context of welding, it should be noted that shunt member 16 may be coupled to core 12 in any suitable manner (e.g., with a brazed connection; a clamp; a fastener; an adhesive; etc.).

In the current embodiment, shunt member 16 is constructed using a number of laminae 22 (e.g., steel plates which are laminated together) (FIG. 3). Although laminated in the current embodiment, it should be noted that shunt member 16 may be constructed in a different manner (e.g., may be solid) while remaining within the scope of the present invention. It should further be noted that the permeability of the shunt member 16 is dependent upon the specific material chosen (here steel) and the specific manner of construction (here laminated). In the current embodiment, the steel plates 22 used for shunt member 16 are chosen such that the permeability of the shunt member 16 is less than the permeability of the core 12.

The core 12 is structured to saturate when a suitably low primary current level flows within the primary conductor 30. Once core portion 12a saturates, flux linkage to core portion 12a is substantially reduced; an effect which will lower the rate of increase of secondary currents and power dissipation in the coil 14. For minimum power dissipation in the coil 14, saturation of core portion 12a should occur at primary currents just above those necessary to power an external device (e.g., a trip unit). Core portion 12b and shunt member 16 may be structured to saturate when a suitably higher primary current level flows within the primary conductor 30.

To facilitate the flow of flux through the shunt member 16, the shunt member 16 must be able to carry the core 12b saturation flux without itself saturating. Therefore, the cross-sectional area of the shunt member 16 is sized larger than the cross-sectional area of the core 12 and/or the shunt member 16 is constructed of a material having a suitably high saturation flux density. Additionally, the contact area of the contact points where the shunt member 16 is coupled to the core 12 is sized to have a greater cross-sectional area than the cross-sectional area of the core 12.

Figure 5:
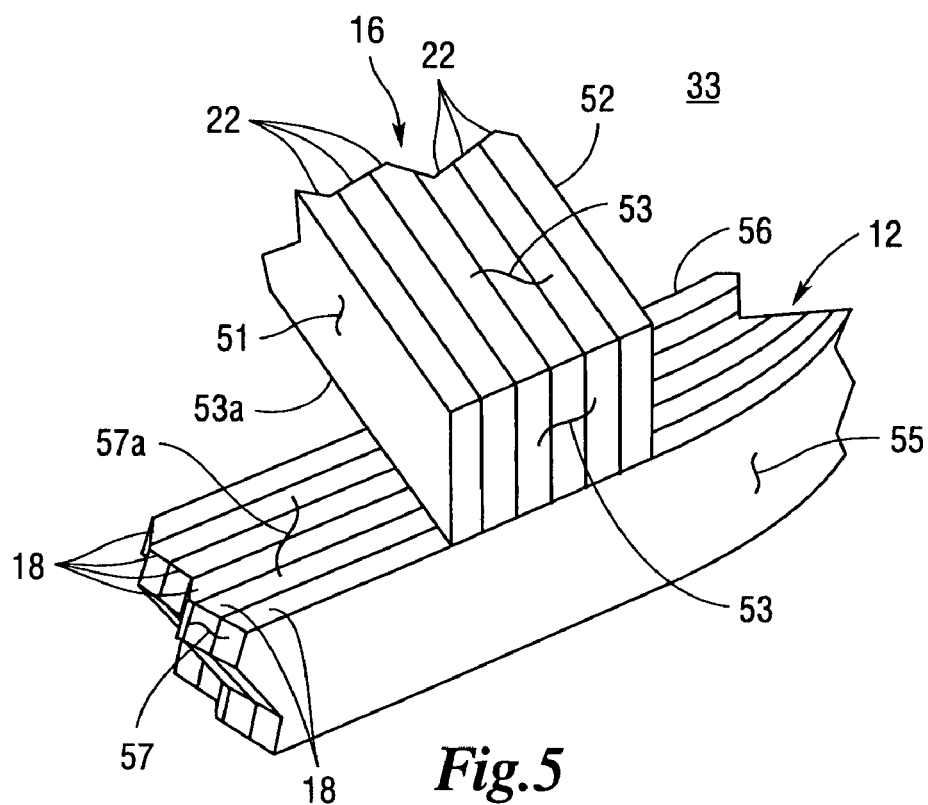
FIG. 5 is an isometric view of a shunt/core interface for the current transformer of FIG. 3.

The shunt member 16 and the core 12 may be coupled edge-on-edge. FIG. 5 is an example of an edge-on-edge core/shunt member interface 33 for the current transformer 10 of FIG. 3. As shown in FIG. 5, when the laminae 22 are coupled together, the shunt member 16 has a top surface 52, a bottom surface 51, and a number of side edges 53. Furthermore, when the laminae 18 are coupled together, the core 12 has a top surface 56, a bottom surface 55, and a number of side edges 57. For the edge-on-edge core/shunt interface illustrated in FIG. 5, side edge 53a of shunt member 16 is coupled to side edge 57a of the core 12.

Figure 6:
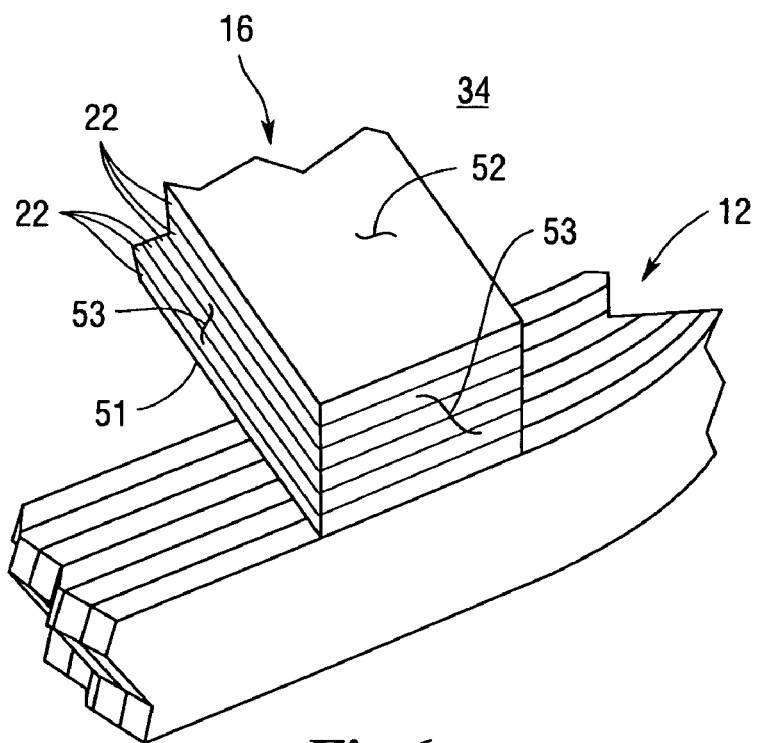
FIG. 6 is an isometric view of a shunt/core interface for a current transformer according to another embodiment of the invention.

Alternatively, the shunt member 16 and the core 12 may be coupled side-on-edge. FIG. 6 is an example of a side-on-edge core/shunt member interface 34 for a current transformer 10' (not shown) according to another embodiment. The shunt member 16 is coupled to the core 12 in such a manner that the bottom surface 51 (with respect to FIG. 6) is in contact with edge 57a of the core 12. Although discussed in the context of edge-on-edge and side-on-edge coupling, it should be noted that other arrangements (for example, a side-on-side arrangement) are within the scope of the present invention.

Figure 7:
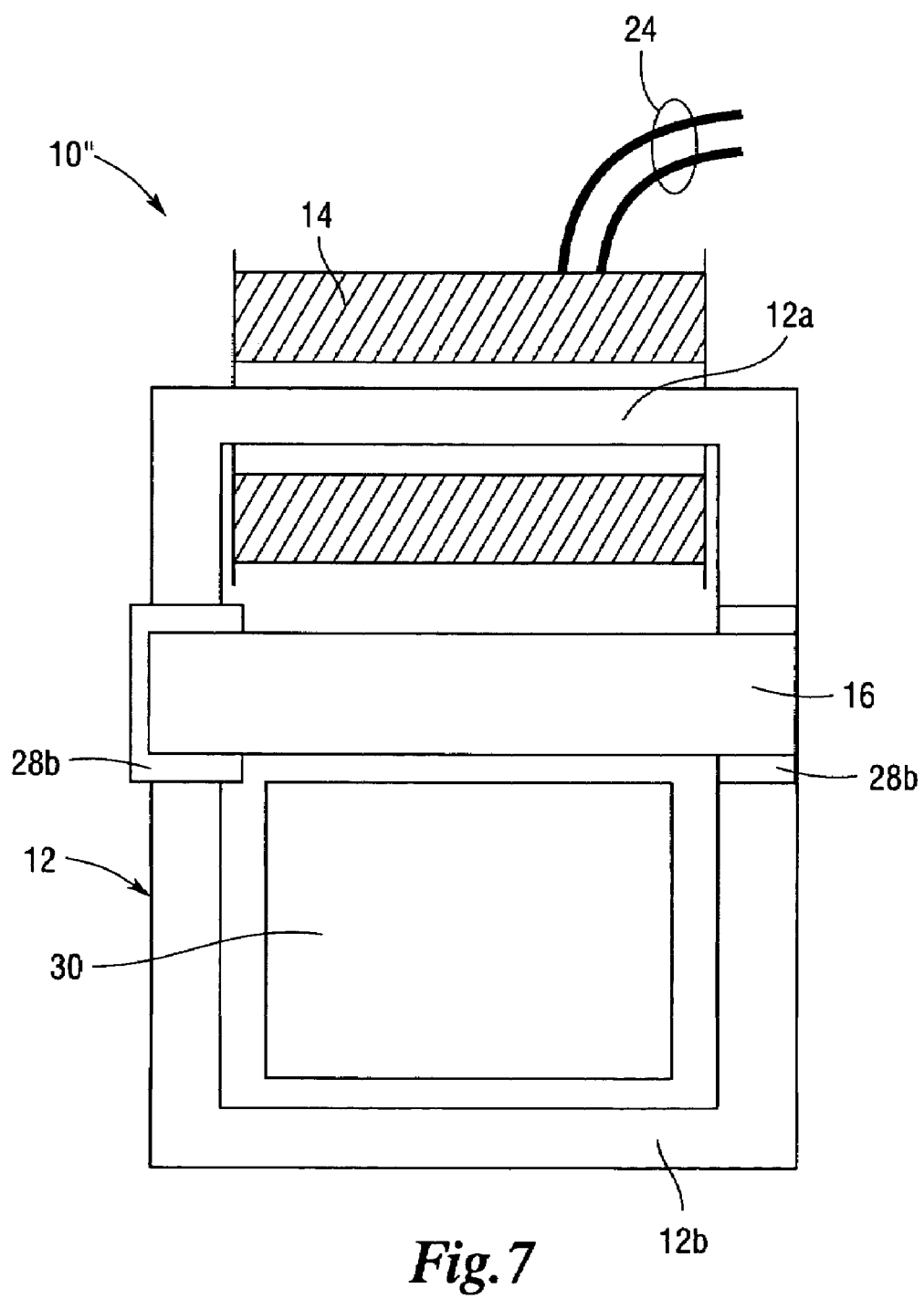
FIG. 7 is a simplified view of a current transformer according to another embodiment of the invention.

FIG. 7 is a simplified view of a current transformer 10" according to another embodiment. In this embodiment, the current transformer 10" includes a number of joining members 28a, 28b interleaved with the shunt member 16 and the core 12 at the contact area between the shunt member 16 and the core 12. As illustrated in FIG. 7, joining member 28a is exemplary of a joining member that conforms to fit between the core 12 and the shunt member 16, whereas joining member 28b is exemplary of a joining member which is a simple slab placed between the core 12 and the shunt member 16. It should be noted that other arrangements may be used for the joining members 28a, 28b while remaining within the scope of the present invention. In the current embodiment, the joining members 28a, 28b are constructed of a composite material having a permeability that is less than the permeability of the core 12 and the permeability of the shunt member 16.

Figure 8:
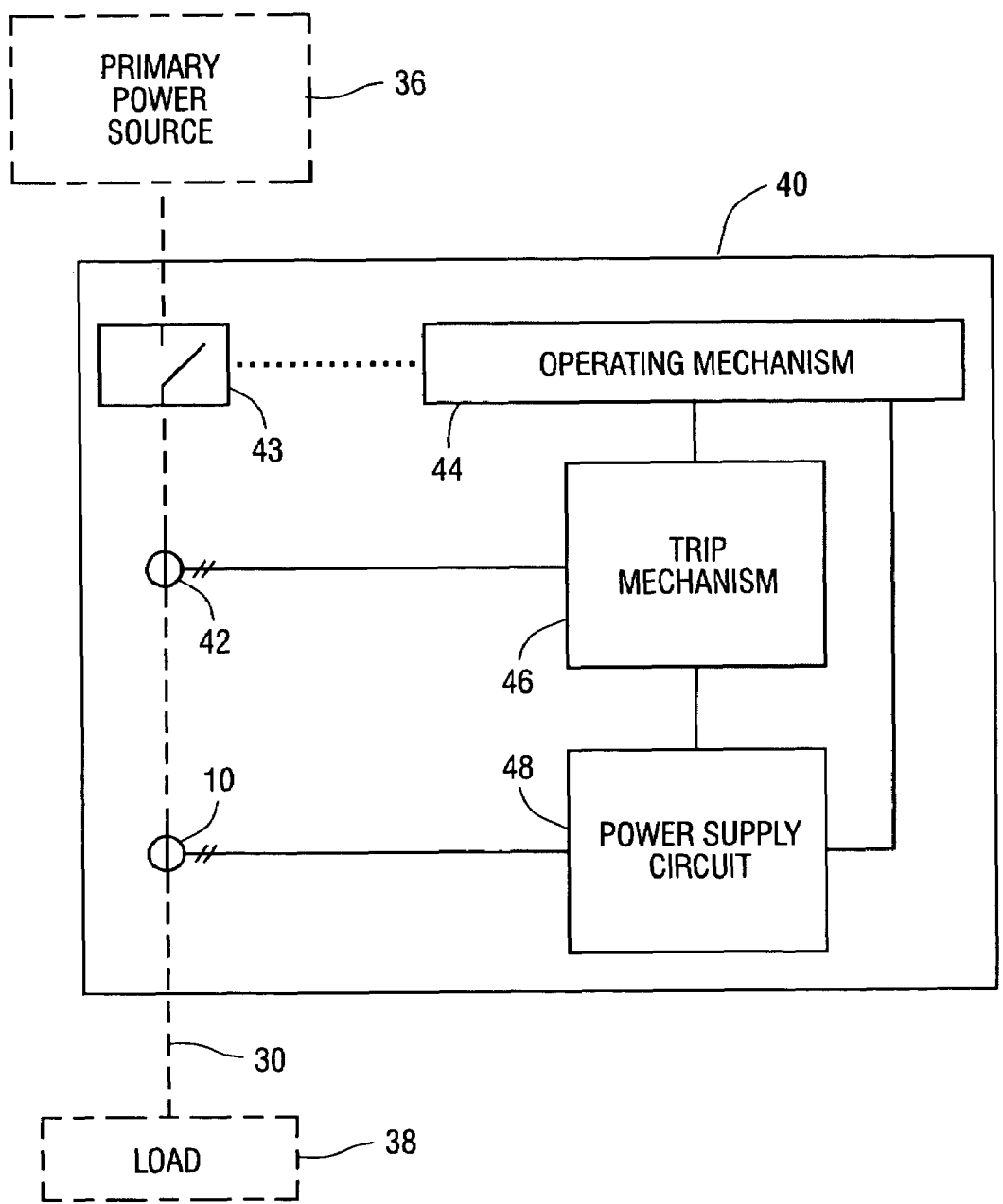
FIG. 8 is a simplified block diagram of a trip device incorporating a current transformer according to another embodiment of the invention.

FIG. 8 shows a trip device 40 which incorporates a current transformer 10 as shown in FIG. 1. The trip device 40 includes a number of separable contacts 43, an operating mechanism 44, and a trip mechanism 46. Trip devices are well known. Examples of trip devices may be found in U.S. Pat. No. 6,144,271 to Mueller et al., U.S. Pat. No. 6,850,135 to Puskar et al., and U.S. Pat. No. 5,943,204 to Jones et al., all of which are incorporated herein by reference. The trip device 40 may also include other components (e.g., without limitation, a processing circuit) (not shown).

The trip device 40 is illustrated in conjunction with a protected circuit which, in the current example, includes a primary power source 36, a load 38, and a primary conductor 30. Typically, the primary power source 36 provides power to the load 38 via the primary conductor 30.

The separable contacts 43 are structured to connect and/or isolate the primary power source 36 from the load 38 in response to the operating mechanism 44. More specifically, separable contacts 43 are structured to allow current flow from the primary power source 36 to the load 38 if a trip condition does not exist and to interrupt current flow from the primary power source 36 to the load 38 if a trip condition exists.

A sensing device 42 is associated with primary conductor 30 such that when a current flows in primary conductor 30, a signal is generated in the sensing device 42. This signal is communicated to the trip mechanism 46, which in response, determines whether a trip condition exists (e.g., whether the current flowing in the primary conductor 30 has exceeded a predetermined threshold). If a trip condition exists, the trip mechanism 46 produces a trip signal which is communicated to the operating mechanism 44.

In response to the trip signal, operating mechanism 44 is structured to open the separable contacts 43 as is well known.

The current transformer 10 is also associated with primary conductor 30 such that when a current flows in primary conductor 30, a current is generated in the coil 14 (FIG. 1) of the current transformer 10. The current generated in the coil 14 is supplied to a power supply circuit 48. The power supply circuit 48 is structured to condition the current supplied by current transformer 10 and to provide power to the other components (e.g., without limitations, trip mechanism 46) of the trip device 40.

Although discussed in the context of supplying current to the power supply circuit 48, it should be apparent that the current transformer 10 may be used in another capacity, for example, as a power transducer, as a frequency sensor, etc. For example, current transformer 10 may be used as a power transducer to replace sensing device 42 for sensing the current flowing in primary conductor 30 and to communicate a signal in response thereto to the trip mechanism 46. As a further example, current transformer 10 may be used for system frequency determination using a zero crossing detector.

Additionally, although discussed in context of the embodiment of current transformer 10 as shown in FIG. 1, it should be apparent that the trip device 40 may incorporate any of the current transformers 10, 10' (not shown), 10" while remaining within the scope of the present invention.

Furthermore, although discussed in the context of a single phase protected circuit, it should be apparent that the present teaching can be adapted for use with a multi-phase protected circuit while remaining within the scope of the present invention.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. A current transformer comprising:
    a coil;
    a core forming a magnetic circuit and having a first permeability, wherein at least a portion of said core is encircled by said coil;
    a shunt member coupled to said core and having a different second permeability, wherein said shunt member is continuous and forms a magnetically parallel path with said at least a portion of said core encircled by said coil; and
    wherein said core comprises a joining member interleaved with said shunt member and said core at least at a contact area between said shunt member and said core, said joining member having a third permeability different than said first permeability and said different second permeability.

2. The current transformer of claim 1 wherein said first permeability is greater than said third permeability and said different second permeability is greater than said third permeability.

3. A trip device for a protected circuit, said trip device comprising:
    separable contacts structured to interrupt a current flowing in said protected circuit;
    an operating mechanism structured to open and close said separable contacts;
    a trip mechanism responsive to a first signal, said trip mechanism cooperating with said operating mechanism to trip open said separable contacts;
    a sensing device associable with said protected circuit, said sensing device outputting said first signal;
    a power supply circuit responsive to a second signal, said power supply circuit structured to provide power to said trip mechanism;
    a current transformer associable with said protected circuit, said current transformer comprising:
    a coil outputting said second signal responsive to said current flowing in said protected circuit;
    a core forming a magnetic circuit and having a first permeability and wherein at least a portion of said core is encircled by said coil;
    a shunt member coupled to said core and having a different second permeability, wherein said shunt member is continuous and forms a magnetically parallel path with said at least a portion of said core encircled by said coil; and
    wherein said core comprises a joining member interleaved with said shunt member and said core at least at a contact area between said shunt member and said core, said joining member having a third permeability different than said first permeability and said different second permeability.

4. The trip device of claim 3 wherein said first permeability is greater than said third permeability and said different second permeability is greater than said third permeability.

* * * * *